United States Patent
Anholt et al.

(10) Patent No.: US 9,136,015 B2
(45) Date of Patent: Sep. 15, 2015

(54) THRESHOLD ADJUSTMENT USING DATA VALUE BALANCING IN ANALOG MEMORY DEVICE

(71) Applicant: Apple Inc., Cupertino, CA (US)

(72) Inventors: Micha Anholt, Tel Aviv (IL); Eyal Gurgi, Petah-Tikva (IL); Barak Baum, Givatayim (IL); Moshe Neerman, Hadera (IL); Moti Teitel, Shoham (IL)

(73) Assignee: Apple Inc., Cupertino, CA (US)

( * ) Notice: Subject to any disclaimer, the term of this patent is extended or adjusted under 35 U.S.C. 154(b) by 228 days.

(21) Appl. No.: 13/908,041

(22) Filed: Jun. 3, 2013

(65) Prior Publication Data

US 2014/0325310 A1     Oct. 30, 2014

Related U.S. Application Data

(60) Provisional application No. 61/815,299, filed on Apr. 24, 2013.

(51) Int. Cl.
| | |
|---|---|
| *G11C 29/00* | (2006.01) |
| *G11C 29/02* | (2006.01) |
| *G06F 11/10* | (2006.01) |
| *G11C 29/42* | (2006.01) |
| *G11C 11/56* | (2006.01) |
| G11C 16/00 | (2006.01) |

(52) U.S. Cl.
CPC .......... *G11C 29/021* (2013.01); *G06F 11/1072* (2013.01); *G11C 11/56* (2013.01); *G11C 11/5628* (2013.01); *G11C 11/5642* (2013.01); *G11C 29/028* (2013.01); *G11C 29/42* (2013.01); *G11C 16/00* (2013.01)

(58) Field of Classification Search
CPC .......... G06F 11/1068; G06F 11/1008
See application file for complete search history.

(56) References Cited

U.S. PATENT DOCUMENTS

| | | | |
|---|---|---|---|
| 6,992,932 B2 | 1/2006 | Cohen | |
| 7,742,339 B2 | 6/2010 | Rizel et al. | |
| 7,864,588 B2 * | 1/2011 | Betser et al. | ............... 365/185.2 |
| 8,000,161 B2 | 8/2011 | Stan et al. | |
| 8,059,439 B2 | 11/2011 | Park | |
| 8,245,094 B2 | 8/2012 | Jiang et al. | |

(Continued)

OTHER PUBLICATIONS

Hongchao Zhou et al, "Error-Correcting Schemes with Dynamic Thresholds in Nonvolatile Memories", 2011 IEEE International Symposium on Information Theory Proceedings, 2011, 4 pages, IEEE.

*Primary Examiner* — Esaw Abraham
(74) *Attorney, Agent, or Firm* — Meyertons, Hood, Kivlin, Kowert & Goetzel, P.C.

(57) ABSTRACT

A method, in a memory including multiple analog memory cells, includes segmenting a group of the memory cells into a common section and at least first and second dedicated sections. Each dedicated section corresponds to a read threshold that is used for reading a data page to be stored in the group. Data to be stored in the group is jointly balanced over a union of the common section and the first dedicated section, and over the union of the common section and the second dedicated section, to create a balanced page such that for each respective read threshold an equal number of memory cells will be programmed to assume programming levels that are separated by the read threshold. The balanced page is stored to the common and dedicated sections, and the read thresholds are adjusted based on detecting imbalance between data values in readout results of the balanced page.

20 Claims, 3 Drawing Sheets

(56) References Cited

U.S. PATENT DOCUMENTS

| | | | |
|---|---|---|---|
| 8,456,911 B2* | 6/2013 | Yuan et al. | 365/185.11 |
| 8,582,381 B2* | 11/2013 | Oowada et al. | 365/211 |
| 8,856,611 B2* | 10/2014 | Wu et al. | 714/758 |
| 8,943,263 B2* | 1/2015 | Frost et al. | 711/103 |
| 2011/0246710 A1 | 10/2011 | Strope | |
| 2012/0254686 A1 | 10/2012 | Esumi et al. | |

* cited by examiner

US 9,136,015 B2

THRESHOLD ADJUSTMENT USING DATA VALUE BALANCING IN ANALOG MEMORY DEVICE

CROSS-REFERENCE TO RELATED APPLICATIONS

This application claims the benefit of U.S. Provisional Patent Application 61/815,299, filed Apr. 24, 2013, whose disclosure is incorporated herein by reference.

FIELD OF THE INVENTION

The present invention relates generally to memory devices, and particularly to methods and systems for adjusting thresholds by balancing the prevalence of one and zero bits.

BACKGROUND OF THE INVENTION

In analog memory devices, a set of thresholds is often used for reading data stored in the memory cells. The process of adjusting the thresholds may be affected by the prevalence of one-bits versus zero-bits in the stored data.

Sulaiman Al-Bassam et al. present balanced codes in "On balanced codes," IEEE Transactions on Information Theory, March, 1990, volume 36 (issue 2), pages 406-408, which is incorporated herein by reference. The paper discusses balanced code wherein each codeword contains an equal number of 1's and 0's. Parallel decoding balanced codes with 2r (or 2r−1) information bits are presented, where r is the number of check bits.

In "Balanced Modulation for Nonvolatile Memories," in Computing Research Repository (CoRR, 2012), which is incorporated herein by reference, Hongchao Zhou et al. present a practical writing/reading scheme in nonvolatile memories, called balanced modulation, for minimizing the asymmetric component of errors. The scheme encodes data using a balanced error-correcting code. When reading information from a block, the scheme adjusts the reading threshold such that the resulting word is also balanced or approximately balanced.

Zhou et al. present schemes with dynamic thresholds in "Error-Correcting Schemes with Dynamic Thresholds in Nonvolatile Memories," Proceedings of the 2011 IEEE International Symposium on Information Theory (ISIT 2011), St. Petersburg, Russia, July 31-Aug. 5, 2011, pages 2143-2147, which is incorporated herein by reference. The authors construct error-correcting schemes with dynamic reading thresholds, so that the asymmetric component of errors are minimized. Additionally, the authors discuss how to select dynamic reading thresholds without knowing cell level distributions, and present several error-correcting schemes.

U.S. Pat. No. 8,059,439, whose disclosure is incorporated herein by reference, discloses an encoding scheme that allows a CAM device to selectively store, within each cell of a row of the CAM device, either a single bit of a binary value or two bits of an encoded data word encoded from the binary value. The encoded data words can be balanced data words that have equal number of logic high and logic low values.

U.S. Pat. No. 8,000,161, whose disclosure is incorporated herein by reference, describes a method of encoding data stored in a crossbar memory array, such as a nanowire crossbar memory array, to enable significant increases in memory size, modifies data words to have equal numbers of '1' bits and '0' bits, and stores the modified words together with information enabling the original data to be retrieved upon being read out from memory.

SUMMARY OF THE INVENTION

An embodiment of the present invention provides a method including, in a memory that includes multiple analog memory cells, segmenting a group of the memory cells into a common section and at least first and second dedicated sections, each dedicated section corresponding to a respective read threshold that is used for reading a data page to be stored in the group. Data to be stored in the group is jointly balanced over a union of the common section and the first dedicated section, and over the union of the common section and the second dedicated section, so as to create a balanced page such that for each respective read threshold an equal number of memory cells will be programmed to assume programming levels that are separated by the read threshold. The balanced page is stored to the common and dedicated sections, and the read thresholds are adjusted based on detecting imbalance between data values in readout results of the balanced page.

In some embodiments, jointly balancing the data includes splitting the data into multiple significance bit pages, and balancing the multiple significance bit pages progressively in increasing order of bit significance. In other embodiments, jointly balancing the data includes performing an approximate balancing of the data for all the read thresholds over the common section, and refining the approximate balancing for each threshold over the dedicated section corresponding to the read threshold. In yet other embodiments, performing the approximate balancing includes dividing the common section into multiple sub-sections, selecting a subset of the sub-sections whose flipping achieves the approximate balancing for all the read thresholds, and flipping the selected subset of the sub-sections.

In an embodiment, selecting the subset of sub-sections includes sequentially processing the sub-sections to decide whether to flip each sub-section, and a decision on a sub-section is fixed when processing subsequent subsections. In another embodiment, selecting the subset of the sub-sections includes accumulating an imbalance measure over the processed sub-sections and deciding to flip a sub-section if flipping of the sub-section reduces a maximum of the accumulated imbalance measure over the read thresholds.

In some embodiments, jointly balancing the data includes flipping one or more bits of the data, and storing the balanced page includes storing flipping information that is indicative of the flipped bits. In other embodiments, the method includes recovering the data by un-flipping the flipped bits using the flipping information. In yet other embodiments, flipping the bits includes flipping a sequential set of the data bits, and the flipping information includes the number of flipped bits.

In an embodiment, the method includes segmenting the data into multiple sub-sections that are each selectively flipped as a unit, and flipping the bits includes flipping a first number of the sub-sections, and further flipping a second number of sequential bits in a subsequent sub-section. In another embodiment, flipping the second number of sequential bits includes checking in parallel multiple bit flipping alternatives in the subsequent sub-section.

There is additionally provided, in accordance with an embodiment of the present invention, apparatus including a memory and a memory controller. The memory includes multiple analog memory cells. The memory controller is configured to segment a group of the memory cells into a common section and at least first and second dedicated sections, each dedicated section corresponding to a respective read threshold that is used for reading a data page to be stored in the group, to jointly balance data to be stored in the group over a union of the common section and the first dedicated section, and over the union of the common section and the second dedicated section, so as to create a balanced page such that for each respective read threshold an equal number of memory cells will be programmed to assume programming levels that are separated by the read threshold, to store the balanced page to the common and dedicated sections, and to adjust the read thresholds based on detecting imbalance between data values in readout results of the balanced page.

There is also provided, in accordance with an embodiment of the present invention, apparatus including an interface for communicating with a memory including multiple analog memory cells, and a processor. The processor is configured to segment a group of the memory cells into a common section and at least first and second dedicated sections, each dedicated section corresponding to a respective read threshold that is used for reading a data page to be stored in the group, to jointly balance data to be stored in the group over a union of the common section and the first dedicated section, and over the union of the common section and the second dedicated section, so as to create a balanced page such that for each respective read threshold an equal number of memory cells will be programmed to assume programming levels that are separated by the read threshold, to store the balanced page to the common and dedicated sections, and to adjust the read thresholds based on detecting imbalance between data values in readout results of the balanced page.

The present invention will be more fully understood from the following detailed description of the embodiments thereof, taken together with the drawings in which:

DETAILED DESCRIPTION OF EMBODIMENTS

Overview

Figure 1:
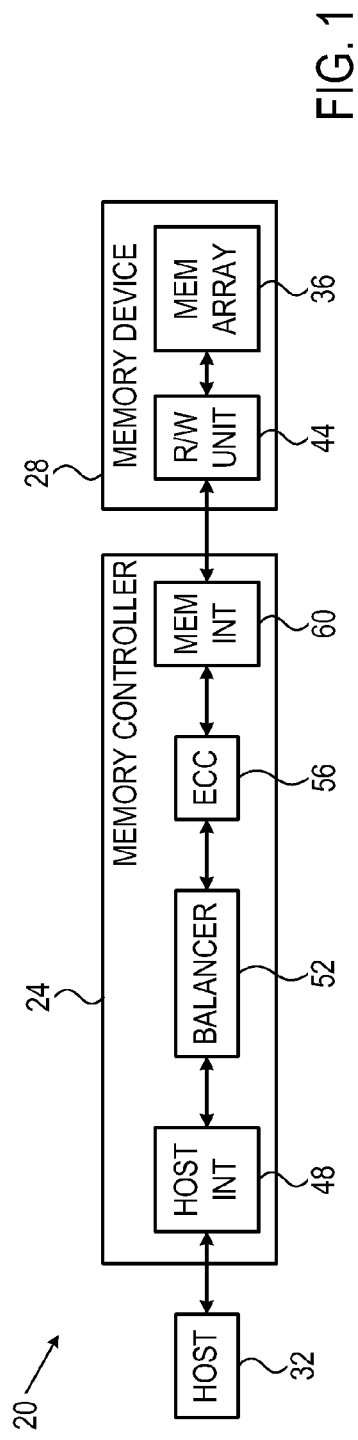
FIG. 1 is a block diagram that schematically illustrates a memory system, in accordance with an embodiment of the present invention.

For reading data out of analog memory cells, a set of read thresholds is often used. The analog values (e.g., threshold voltages) of the cells are read and compared to one or more read thresholds to retrieve the stored data bits. During the lifetime of the memory device, multiple factors may alter the analog values read out of the memory cells. As a result, the probability for read errors increases, and the read thresholds should be adjusted accordingly.

One approach for read threshold adjustment is based on storing balanced data. Generally, balanced data means data that is distributed evenly among the programming levels. In a Single-Level Cell (SLC) memory that stores 1 bit/cell using two programming levels, for example, a balanced page of data comprises a substantially equal number of one and zero bits. In a Multi-Level Cell (MLC) memory that stores N bits/cell in $2^N$ programming levels, balanced data means that substantially the same number of memory cells is programmed to each of the $2^N$ programming levels.

When storing balanced data, the data is typically expected to remain balanced when it is read. An imbalance detected when reading the balanced data is indicative of a change in the read analog values relative to the read thresholds. Therefore, the detected imbalance may be used to adjust the thresholds to achieve balanced read data.

Embodiments of the present invention that are described herein provide improved methods and systems for adjusting read thresholds by storing balanced bit sequences.

In an embodiment, data comprising a bit sequence is stored in a SLC memory device that comprises analog cells of 1 bit/cell capacity. The number of one and zero bits in the sequence is first balanced by flipping a selected set of bits. The locations of the flipped bits in the sequence are referred to as flipping information. The balanced data is stored along with the flipping information. When reading data out of the memory the flipping information is used to un-flip the previously flipped bits, thus retrieving the original data. In case imbalance is detected in the read data, read thresholds are adjusted accordingly. In some embodiments, the set of flipped bits comprises the first i bits in the sequence. In such embodiments, i is referred to as a flipping index and serves as the flipping information.

In other embodiments, data is stored in a MLC memory device of 2 bits/cell capacity or higher. Data pages are balanced and stored sequentially, starting with the least significant bit (LSB) page. Consider, for example, a 2 bits/cell device that stores an LSB page and a most significant bit (MSB) page in a group of memory cells. The LSB page is balanced similarly to the method described above for 1 bit/cell devices. To balance the MSB page, the group of memory cells is partitioned into two subsets, based on the least significant bits written in the already balanced LSB page. Each subset of the MSB page is separately balanced and stored with respective flipping information.

When reading a MSB page in such a scheme, the LSB page should be available in order to classify each cell to the appropriate subset and un-flip bits in each subset to retrieve the original MSB data. In higher-order MLC, higher significance bit pages are processed similarly to the MSB page with partitioning based on lower significance bit combinations stored in cells of already balanced lower significance bit pages.

The above-described method balances all the pages stored in a given group of memory cells. Moreover, programming levels are evenly distributed among the cells, so that sequences of equal length (and therefore similar amount of statistical information) may be used for thresholds adjustment in each page.

In yet other embodiments, a group of memory cells is divided into a common section and multiple smaller dedicated sections. Each dedicated section corresponds to a respective read threshold and programming levels that are separated by that threshold. LSB, MSB, and possibly higher significance bit pages are first approximately balanced over the memory cells in the common section. Then, for each dedicated section and respective read threshold, memory cells that are programmed to the two levels separated by that threshold are jointly balanced with the common section. Having a large common section enables the usage of longer sequences for threshold adjustment, thus increasing the amount of statistical information used. Additionally, pages can be read independently of each other.

In an embodiment, data pages are balanced approximately but efficiently. The LSB page is balanced first, followed by the MSB and possibly higher significance bit pages. A group of cells where a data page is to be written is divided into small subsections or chunks of cells. The bits in a chunk of cells can be flipped as a unit. Chunks are processed sequentially, wherein each chunk is flipped or left as is. The criterion to flip (or not to flip) a chunk is based on estimating whether flipping (or not) reduces the ones to zeros imbalance towards zero. As chunks are processed, flipping decisions on previous chunks are not allowed to be changed. This greedy approach significantly reduces the number of tested flipping combinations and therefore reduces the complexity and CPU cycles consumption.

In some embodiments, an efficient method for balancing via bit flipping of the first i bits is used. The bit sequence to be balanced is divided into small chunks. Estimation of the position of the balancing flipping index i is carried out in terms of chunk units. Then, all the bits of a respective number of first chunks are flipped. Further chunks are then sequentially processed to balance the whole sequence. In a processed chunk, alternative patterns of flipping the first j bits are checked in parallel, thus significantly decreasing the number of CPU cycles consumed.

In an embodiment, a group of cells is partitioned into a common section and multiple dedicated sections. A data page is first approximately balanced in the common section. Approximate balance is efficiently achieved using a greedy approach that flips multiple bits as a unit (referred to as "chunk"), thereby reducing the number of flipping combinations. Then, joint balancing is performed for the data page in a union of each dedicated section and the approximately balanced common section. Joint balancing is efficiently carried out by flipping chunks of bits and by parallel checking of multiple flipping alternatives.

In summary, the disclosed techniques efficiently balance data to be stored in a group of memory cells. Additionally, the disclosed techniques enable independent reading of different significance pages. Moreover, the disclosed techniques achieve balancing with relatively large and similar amount of statistical information for threshold adjustment among the page read thresholds.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory controller 24, which stores data in a memory device 28 and retrieves data stored in the memory device. Memory controller 24 communicates with a host 32, for accepting data for storage in the memory device and for outputting data retrieved from the memory device.

Memory device 28 stores the data received from the memory controller in a memory cell array 36. The memory array comprises multiple analog memory cells. In the context of the present patent application and in the claims, the term "analog memory cell" is used to describe any memory cell that holds a continuous, analog value of a physical parameter, such as an electrical voltage or charge. Array 36 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

Memory device 28 comprises a reading/writing (R/W) unit 44, which converts data for storage in the memory device to analog storage values and writes them into the memory cells. In alternative embodiments, the R/W unit does not perform the conversion, but is provided with voltage samples, i.e., with the storage values for storage in the cells. When reading data out of array 36, R/W unit 44 converts the analog storage values of the memory cells into digital samples (also referred to as alphabet symbols) having a resolution of one or more bits. Data is typically written to and read from the memory cells in groups that are referred to as pages. In some embodiments, the R/W unit can erase a group of cells by applying one or more negative erasure pulses to the cells.

Memory controller 24 comprises a host interface 48 for communicating with host 32. The data accepted from the host is processed by a balancer unit 52 before it is sent to memory device 28 for storage. The balancer reversibly flips data bits to balance the number of cells among programming levels that are separated by respective read thresholds. If retrieving stored balanced data results in impaired balance, the memory controller may adjust reading thresholds accordingly. Balancer 52 un-flips back data bits in balanced data retrieved from memory device 28 before providing the data to the host. Flipping information that is needed to perform the un-flipping is typically stored with relation to the balanced data. Several example balancing schemes are described in detail below.

In some embodiments, memory controller 24 comprises an Error Correction Code (ECC) unit 56, which encodes the data for storage using a suitable ECC and decodes the ECC of data retrieved from the memory. Any suitable type of ECC, such as, for example, Low Density Parity Check (LDPC), Reed-Solomon (RS) or Bose-Chaudhuri-Hocquenghem (BCH), can be used. In some embodiments, the memory controller encodes using ECC unit 56 both the balanced data and the flipping information, and stores the resulting code word in a data page. Memory controller 24 communicates with memory device 28 using a memory interface 60.

Some or all of the elements of memory controller 24, and in particular balancer unit 52, may be implemented in hardware. Example implementations of unit 52 are described further below. Alternatively, the memory controller may comprise a microprocessor that runs suitable software, or a combination of hardware and software elements.

The configuration of FIG. 1 is an example system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity. Although FIG. 1 shows a single memory device 28 for the sake of clarity, in alternative embodiments a single memory controller may control multiple memory devices 28.

In the exemplary system configuration shown in FIG. 1, memory controller 24 and memory device 28 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 24 can be implemented in software and carried out by a processor or other element of the host system. In some embodiments, host 32 and memory controller 24 may be fabricated on the same die, or on separate dies in the same device package.

In some embodiments, memory controller 24 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

In an example configuration of array 36, the memory cells are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. In a typical implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Typical memory devices may comprise several thousand erasure blocks. In a typical two-bit-per-cell MLC device, each erasure block is on the order of thirty-two word lines, each comprising several thousand cells. Each word line of such a device is often partitioned into four pages (odd/even order cells, least/most significant bit of the cells). Three-bit-per cell devices having thirty-two word lines per erasure block would have 192 pages per erasure block, and four-bit-per-cell devices would have 256 pages per block. Alternatively, other block sizes and configurations can also be used.

Some memory devices comprise two or more separate memory cell arrays, often referred to as planes. Since each plane has a certain "busy" period between successive write operations, data can be written alternately to the different planes in order to increase programming speed.

Threshold Adjustments Via Bit Balancing

Data stored in analog memory devices is often represented by certain programming levels (corresponding to ranges of charge or threshold voltage). To read a data page, the stored analog values are compared to respective predefined read thresholds that separate between the programming levels. During the device lifetime the analog values of the memory cells may change, and therefore reading using fixed read thresholds may result in reading errors. Multiple factors may affect the analog values, such as inter-cell interference, threshold voltage drift caused by charge leaking out of the cells, and widening of the programming levels distributions, to name a few.

Assume a certain data (denoted DATA) that comprises N1 one bits and N0 zero bits. The excess of one bits over zero bits, also referred to as ones-excess, is therefore given by N1-N0. In some embodiments, before storing, the memory controller balances DATA to generate a sequence denoted BALANCED_DATA having an equal number of one and zero bits.

The ones-excess value of a sequence is denoted E, wherein for balanced data E=0. In general, the ones-excess can be interpreted as an imbalance measure. A bit sequence whose ones-excess equals zero is also referred to as a perfectly balanced sequence.

Further assume that reading BALANCED_DATA from the memory results in a sequence having N1' one bits, and N0' zero bits, i.e., a ones-excess value E' given by E'=N1'-N0'. Due to reading errors however, E' is often nonzero. E' is indicative of the level and direction of the imbalance, and may be used to adjust the reading thresholds.

Balancing in SLC Devices

SLC devices store a single bit per cell. Consider a bit sequence X comprising N1 one bits and N0 zero bits. X may represent a data page to be stored in the SLC cells. In case N1≠N0, X may be balanced by flipping one or more bits. Let $D_i(X)$ denote the ones-excess value of a sequence X' resulting by flipping the first i bits. The index i is referred to herein as a flipping index. Further assume that X' comprises N1' one bits and N0' zero bits. $D_i(X)$ may be positive if N1'>N0', negative if N1'<N0', or zero if N1'=N0'. Note that taking the original sequence X (i.e., zero flipping) results in $D_0(X)$=N1−N0. As another extreme example, flipping all the bits results in $D_N(X)$=N0−N1=−$D_0(X)$. Thus, for i=0 and i=N, $D_i(X)$ gets opposite values.

As an example, consider a sequence X=1001110011. X has 6 one bits and 4 zero bits. The ones-excess value for X is given by $D_0(X)$=6−4=2. Flipping the first i=5 bits, results in a balanced sequence X', given by X'=0110010011, for which $D_0(X')$=$D_5(X)$=0.

Note that with respect to the index i=0, . . . , N the function $D_i(X)$ behaves as a continuous function that gets opposite values for i=0 and i=N as described above. Therefore, there must be an index i in the range 0-N for which $D_i(X)$=0. In other words, for any sequence X, a flipping index i0 can be found, such that $D_{i0}(X)$=0. i0 is referred to as a balancing flipping index. In other words, it is always possible to perfectly balance a bit sequence by flipping a suitable number of sequential bits, starting with the first bit.

On the other hand, for a given E≠0, flipping the first i bits cannot guarantee $D_i(X)$=E for any flipping index i. Therefore, creating a predefined intentional level of imbalance cannot be guaranteed.

In some embodiments, to write balanced data, the memory controller first finds a balancing flipping index i0. The memory controller then flips all the bits in the range 1, . . . , i0. The memory controller then encodes both the balanced data and i0 using ECC 56 and stores the result code word to a page of cells.

Thus, the data stored in the memory cells (excluding the ECC redundancy bits) is balanced, at the expense of some (known) flipped bits. In some embodiments, to additionally balance the ECC redundancy bits, a flipped version of the ECC redundancy bits is added and stored, following, for example, the data and ECC parts. In the current context, the term "balanced" refers to a perfect balance, or alternatively to an approximate balance up to some allowed predefined level of imbalance. Example methods for perfect and approximate balancing methods are described further below.

To retrieve the original data, the memory controller reads the page using a suitable threshold. Then the memory controller decodes the read data to extract the balanced sequence and corresponding flipping index i0. The memory controller un-flips the sequence bits in the range 1, . . . , i0 to recover the original data. In case the data read from the memory cells is found to be unbalanced, the memory controller may use the current ones-excess value to adjust the reading threshold accordingly. Note that for threshold adjustment there is no need to apply ECC decoding, since no un-flipping is required.

In some embodiments, the ECC coding scheme does not alter the balanced data bits that are used for threshold adjustments. Examples for such coding schemes include, for example, systematic coding, wherein the code word comprises the input data plus separate redundancy bits.

In alternative embodiments, the balancing flipping index may be encoded using an ECC different from the ECC used for protecting the data, and possibly stored in another page of cells. In such embodiments, the memory controller can first encode the data using an ECC and then balance the result code word. Additionally, the memory controller may apply data scrambling to achieve approximate balancing prior to final balancing using balancer 52.

The described above method for SLC employs sequence balancing via flipping the first i bits. In alternative embodiments however, any other suitable flipping scheme may be used.

A method for efficient balancing by flipping a suitable number of first bits is described further below.

In some embodiments, approximate threshold adjustment is sufficient. In such embodiments, data can be stored with some allowed level of imbalance. For example data can be balanced to have a ones-excess value that is lower than a predefined threshold. As an example, for a 4 Kbytes chuck an allowed imbalance in the range 5-20 bits may be used. Alternatively, however, any other suitable allowed imbalance may be used.

Balancing in MLC Devices

In MLC devices data is stored using more than two programming levels. For example, a 2 bits/cell device uses four programming levels, and a 3 bits/cell device uses eight programming levels.

Figure 2:
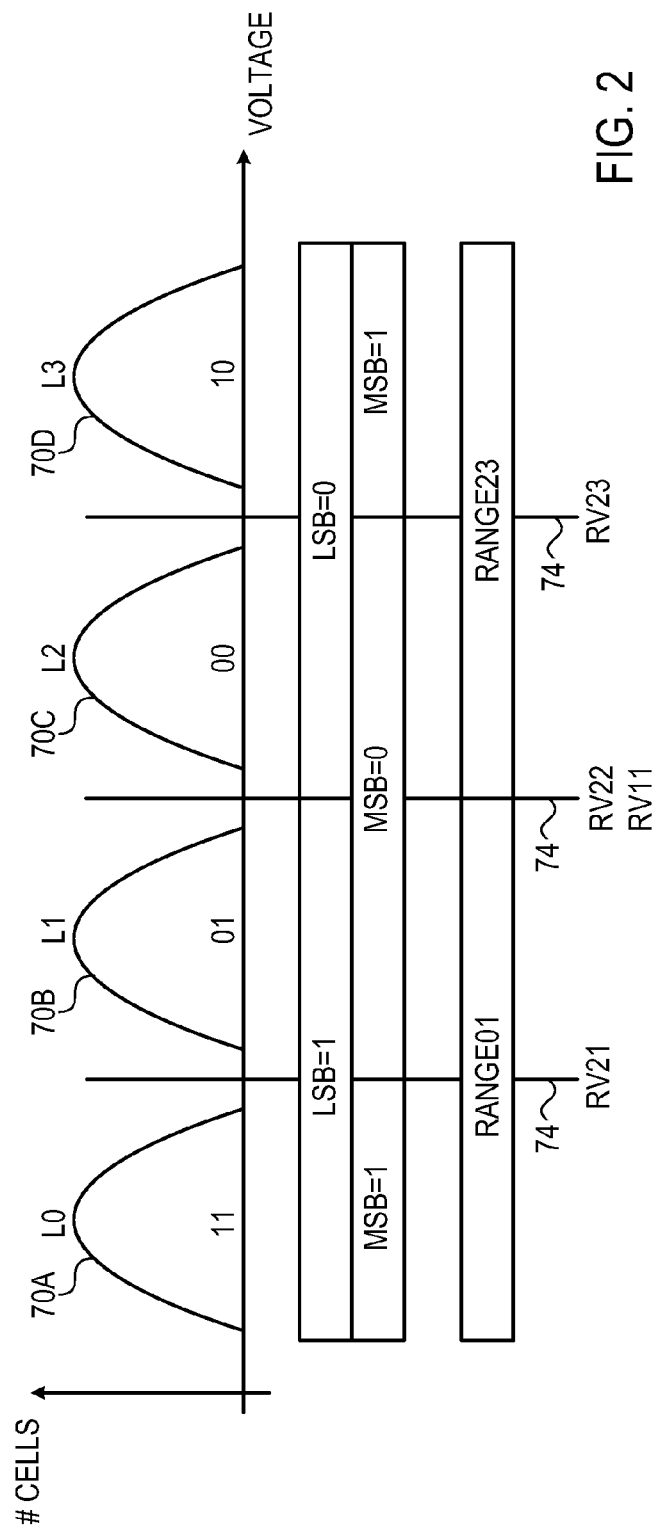
FIG. 2 is a diagram that schematically illustrates programming level distributions, in accordance with an embodiment of the present invention.

FIG. 2 is a diagram that schematically illustrates analog value (e.g., threshold voltage) distributions in a group of 2 bits/cell memory cells, in accordance with an embodiment of the present invention. The figure depicts four distributions 70A-70D of analog values, corresponding to respective programming levels L0-L3. Two data bits are stored by programming a cell to assume one of the four programming levels. For example, to store a bit pair whose LSB=1 and MSB=0, the cell is programmed to assume the level L1. Bit pairs are also referred to as symbols.

In FIG. 2, three vertical lines 74 represent read thresholds that separate between the different programming levels. The threshold RV21 separates between the levels L0, L1. Similarly, the threshold RV23 separates L2 from L3. RV11 is equal to RV22 and both equally separate between L1 and L2.

The memory controller typically programs and reads data in units of pages. A LSB (or MSB) page refers to the least (or most) significant bits stored in the page cells. To read a LSB page, the memory controller compares the analog values read out of the cells to RV11. Values below RV11 are interpreted as LSB=1 and levels above RV11 are interpreted as LSB=0. To read a MSB page, the memory controller uses both the RV21 and RV23 thresholds, wherein a level between RV21 and RV23 is interpreted as MSB=0, and a level below RV21 or above RV23 is interpreted as MSB=1.

In FIG. 2, the horizontal (voltage) axis is split by RV11 into two ranges denoted RANGE01 and RANGE23. By identifying the range in which each analog voltage falls, the memory controller is able to divide the memory cells into two subsets: A first subset (analog voltage in RANGE01) contains the memory cells that store bit pairs whose LSB equals one. A second subset (analog voltage in RANGE23) contains the memory cells that store bit pairs whose LSB equals zero. In the description that follows, the terminology cells in RANGE01 (or RANGE23) means cells in the respective subset.

We now describe an example scheme for balancing the LSB and MSB pages in a 2 bits/cell MLC device in accordance with an embodiment of the present invention.

In principle, each of the LSB and MSB pages may be balanced independently similarly to the SLC balancing method described above. By independent balancing, however, prevalence of stored symbols may be significantly uneven. In other words, the fact that each of the LSB and MSB pages is balanced does not mean that the memory cells are distributed evenly among programming levels L0 . . . L3.

For example, consider a LSB sequence given by 000111 and a MSB sequence given by 111000. Each of the given sequences is perfectly balanced. The symbols 00 and 11, however, are totally missing. As explained below, it is desirable to have a similar number of cells programmed to each of the levels (or equivalently to a corresponding symbol), so that bit sequences of similar length (and thus similar amount of statistical information) serve for adjusting the different thresholds.

The LSB page may be balanced using the SLC balancing technique described above. Note that when balancing the MSB page after the LSB page is balanced, the subsets partitioned by RANGE01 and RANGE23 each comprise half of the memory cells allocated for storing that page.

An MSB page should be balanced for each of the two thresholds RV21 and RV22. Note that for adjusting RV21, and given that the LSB page is already balanced, it is sufficient to balance between the number of cells that are programmed to levels L0 and L1. A similar argument holds for RV23 and respective levels L2, L3. After balancing the LSB page, the memory controller separately balances the MSB page for the cells in the subset defined by RANGE01, and for the cells in the subset defined by RANGE23. The method results in perfect balancing of the MSB page. Moreover, exactly ¼ of the cells are programmed to each of the four levels L0-L3.

It should be appreciated that in the above described method for MLC, reading the MSB page requires the availability of the LSB page, to partition the cells into the subsets defined by RANGE01 and RANGE23. Since at the time of balancing the MSB page, flipping is carried out separately for cells in RANGE0 and RANGE1, the opposite operation of un-flipping should be carried out over the same cell groups to retrieve the original data.

The method described above for 2 bits/cell MLC can be extended to MLC with higher significance pages as well. For example, the upper significant bit (USB) page in a 3 bits/cell device is programmed using eight programming levels. In such a device, the LSB and MSB pages may be balanced as described above for the 2 bit/cell device. For the USB page, cells are partitioned into four subsets according to respective four range levels. The four levels correspond to respective 2 bit combinations of the lower significance bits. The method can be readily extended to devices that store any suitable number of bits per cell.

Independent Page Balancing

Figure 3:
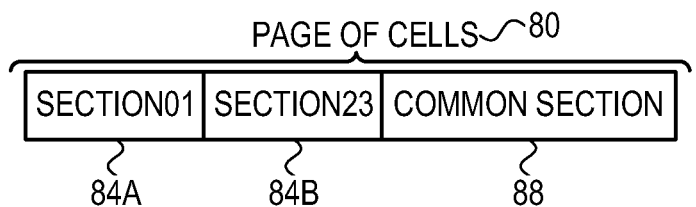
FIG. 3 is a diagram that schematically illustrates a segmented page of memory cells, in accordance with an embodiment of the present invention.

FIG. 3 is a diagram that schematically illustrates a segmented page 80 of memory cells, in accordance with an embodiment of the present invention. This method allows independent reading of pages. Page 80 is segmented into dedicated memory cell sections 84A and 84B, and a common section 88. LSB and MSB data pages are similarly segmented into the different sections.

In this embodiment, the memory controller first approximately balances the LSB and MSB pages in the common section. Then, the memory controller separately performs a joint fine balancing of the union of each dedicated section and the common section. A method for approximate balancing is described in FIG. 6 further below. Parts of the LSB page to be stored in common section 88, or in dedicated sections 84A and 84B are referred to as a common LSB page and dedicated LSB pages respectively. Similarly, parts of the MSB page to be stored in common section 88, or in dedicated sections 84A and 84B are referred to as a common MSB page and dedicated MSB pages respectively.

In an example embodiment, a data page is stored in a group of 8,000 memory cells, i.e., page 80 comprises 8,000 cells. A typical partitioning in this example can allocate 4,000 cells for common section 88 and 2,000 cells to each dedicated section 84A and 84B. In alternative embodiments, however, any suitable number of cells may be allocated for storing a data page, and any suitable partitioning to common and dedicated sections may be selected.

Figure 4:
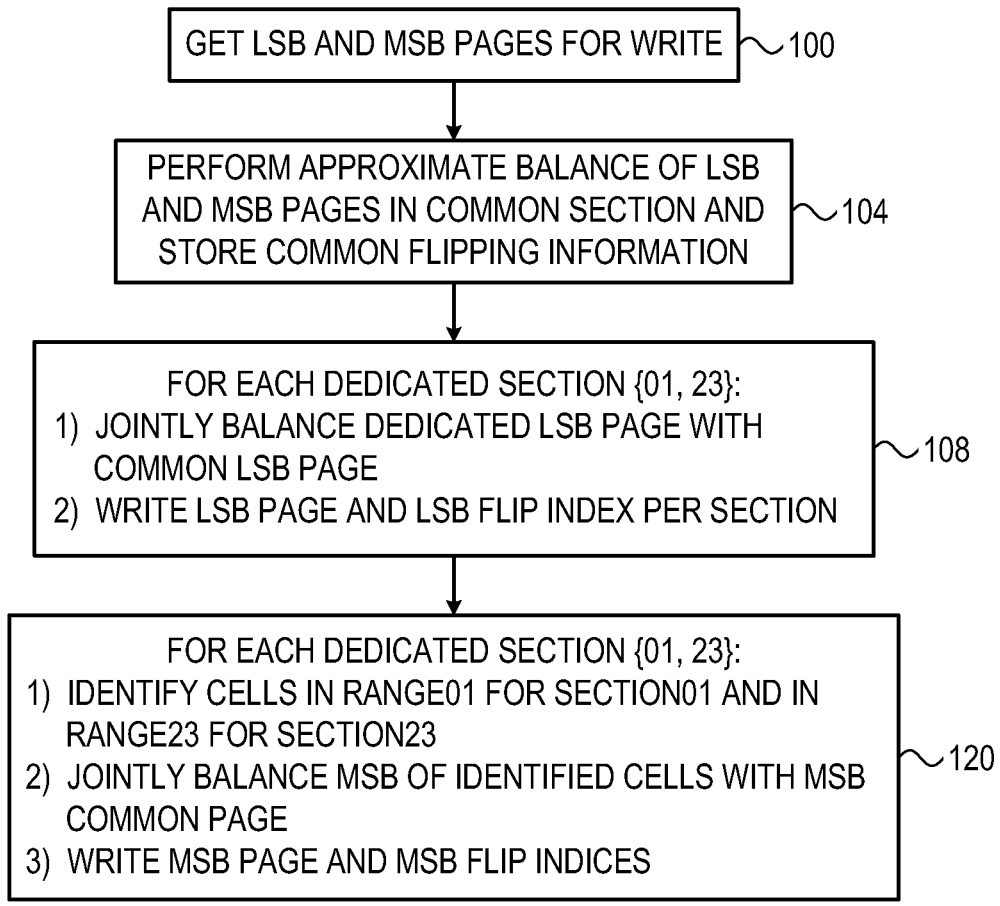
FIG. 4 is a flow chart that schematically illustrates a method for balancing pages for writing, in accordance with an embodiment of the present invention.

FIG. 4 is a flow chart that schematically illustrates a method for balancing pages for writing, in accordance with an embodiment of the present invention. The method enables independent reading of data pages. The method begins with memory controller 32 getting LSB and MSB pages for writing, at a get page step 100. The memory controller first performs an approximate balance to the common LSB page and then to the MSB page of common section 88, at a common balance step 104.

Approximate balancing typically yields a different number of cells programmed to levels that are separated by a respective read threshold. Moreover, the imbalance due to approximate balancing for cells in RANGE01 may be different from the imbalance for cells in RANGE23. An imbalance in the common section is also referred to as a common imbalance. Still at step 104, the memory controller stores flipping information for the common LSB and MSB pages. An example method for approximate balancing is described in FIG. 6.

Next, the memory controller jointly balances each dedicated LSB page (i.e., the part of the LSB page in that dedicated section) with the common LSB page at a balance LSB step 108. In the example of FIG. 3 above, the memory controller balances the LSB over the union of sections 84A and 88, and separately over the union of sections 84B and 88.

As an example, assume the ones-excess of the LSB common page due to approximate balancing is E=5. To jointly balance each dedicated LSB page with the common LSB page, an opposite imbalance, i.e., −5 is created in each dedicated LSB page. At step 108, a dedicated LSB page and a corresponding flipping index (by which the opposite imbalance was created) is written to the memory per dedicated section.

The memory controller proceeds to a balance MSB page step 120. Step 120 comprises three sub steps for each dedicated section as follows: 1) the memory controller identifies for SECTION01 cells in RANGE01 and for SECTION23 cells in RANGE23. 2) The memory controller identifies cells in RANGE01 and in RANGE23 in the common section. In general, the common imbalance for cells in RANGE01 and RANGE23 may be different. The memory controller then jointly balances the MSB of corresponding identified cells in the dedicated and common sections. The joint balancing is carried out similarly to the description above for dedicated LSB pages, by creating an opposite imbalance.

Note that for the joint MSB balancing, only half of the cells are used relative to the dedicated LSB page. For SECTION01, flipping cells in RANGE23 has no impact on the balancing in RANGE01. Therefore flipping is carried out for all the cells up to the balancing flipping index and not only for cells in RANGE01. Similar argument holds for SECTION23. Since flipping index is independent of cells classification to either RANGE01 or RANG32, reading the MSB page is possible independently of the LSB page. 3) The memory controller writes the dedicated MSB pages and a flipping index per dedicated section.

The method of FIG. 4 described above for 2 bits/cell MLC can be extended to MLCs with higher significance pages as well. For example, the upper significant bit (USB) page in a 3 bits/cell device is programmed using eight programming levels. In such a device, page 80 is partitioned into a common section and four dedicated sections. The LSB and MSB pages are balanced as described above for the 2 bit/cell device, but for each of the four subsections. The MSB page is balanced for cells having LSB=1 in two subsections and for cells having LSB=0 for the other two subsections. The USB page is approximately balanced in the common section and then the USB page in each of the four dedicated sections is jointly balanced with the USB in the common section. For the USB page, balancing in each dedicated subsection is performed for cells having respective lower significance bit combinations. The method can be similarly extended to a device configured to any suitable number of bits per cell.

Figure 5:
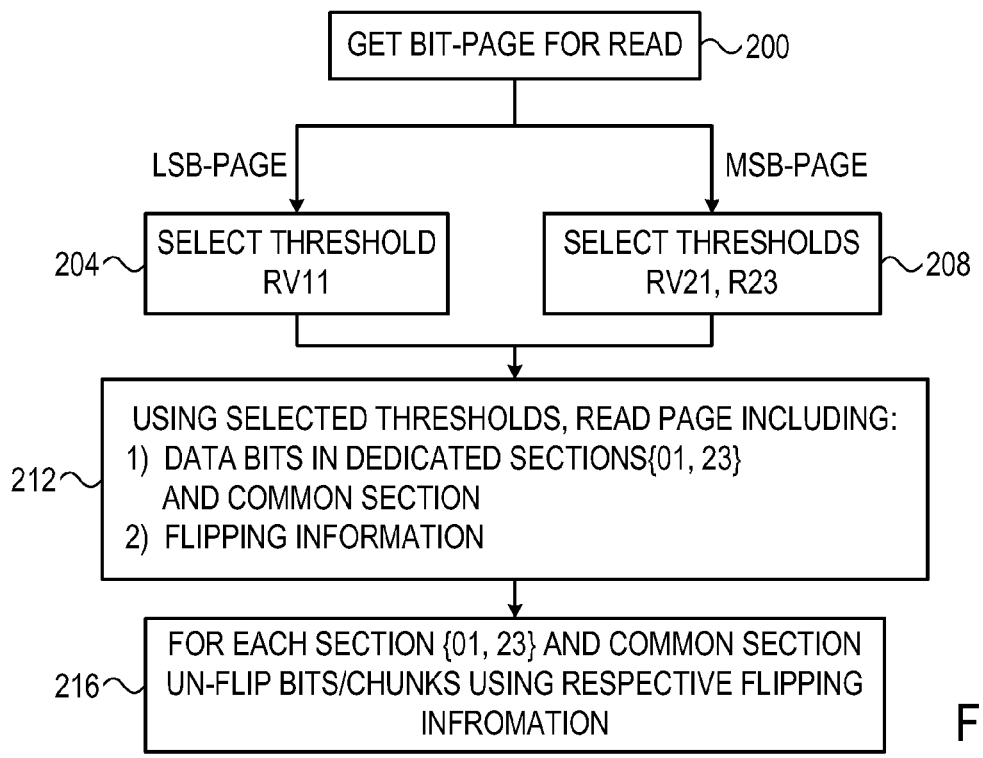
FIG. 5 is a flow chart that schematically illustrates a method for reading a balanced page, in accordance with an embodiment of the present invention.

FIG. 5 is a flow chart that schematically illustrates a method for reading a balanced page, in accordance with an embodiment of the present invention. The page may have been previously written using, for example, the method of FIG. 4. The method enables reading a page independently of other pages stored in the same group of cells.

The method begins with the memory controller getting a bit-page to read, at a get read bit-page step 200. The bit-page indicates whether to read the page as a LSB or a MSB page. In case the requested page is a LSB page, the memory controller selects the threshold RV11, at a select LSB threshold step 204. Otherwise, the requested page is a MSB page, and the memory controller selects two thresholds, RV21 and RV23, at a select MSB threshold step 208.

The memory controller then proceeds to a read page step 212, in which a page unit is read from the memory using respective read thresholds selected at step 204 or 208. The data read comprises data bits of the respective balanced page (LSB or MSB) stored in the dedicated and common sections, and respective flipping information.

The memory controller next performs un-flipping to retrieve the original data page, at an un-flipping step 216. The memory controller un-flips bits in each dedicated section and un-flips chunks in the common section based on the flipping information retrieved at step 212. Step 216 thus terminates the method with the original data retrieved.

In the methods of FIGS. 4 and 5, the common section is typically selected larger than the dedicated sections. For example, assume a page of 8K cells. In the method of dependent page reading described above, the MSB page is divided into two groups of cells according to RANGE01 and RANGE23, each comprising 4K cells. Therefore, there are 4K bits participating in sequence balancing and thresholds adjustment. On the other hand, in the methods of FIGS. 4 and 5, assume the common section comprises 4K cells and each dedicated section comprises 2K cells, wherein 1K cells (per section) in RANGE01 or RANGE23 are used for balancing. Therefore, a total of 5K=4K+1K bits participate in sequence balancing and thresholds adjustment, i.e., an improvement of 20%.

In the method of FIG. 4, balance is achieved by flipping the first i bits to generate imbalance that is opposite to the imbalance in the common section. As described above, however, unlike perfect balancing, there may be no flipping index that achieves a given imbalance. In some embodiments, a scrambling unit is positioned between host interface and balancer 52. In such embodiments, the memory controller may re scramble with a different seed and run the method of FIG. 4 over again.

Thresholds Adjustment

Memory controller 24 may perform read thresholds adjustment when the memory system is first put to service. Additionally or alternatively, the memory controller may occasionally perform thresholds adjustment, for example, if the ECC error rate exceeds a predefined threshold, or after a predefined number of erase/program cycles, or due to any other suitable criterion.

Thresholds adjustment is typically carried out for each threshold separately. For example, to adjust the RV21 threshold, the memory controller first reads one or more MSB pages using, for example, the method of FIG. 5. Then the memory controller counts the ones-excess in the read page or pages and adjusts RV21 accordingly. As another example, to adjust RV11, the memory controller reads one or more LSB pages and again uses the ones-excess count of the retrieved data to adjust RV11.

Figure 6:
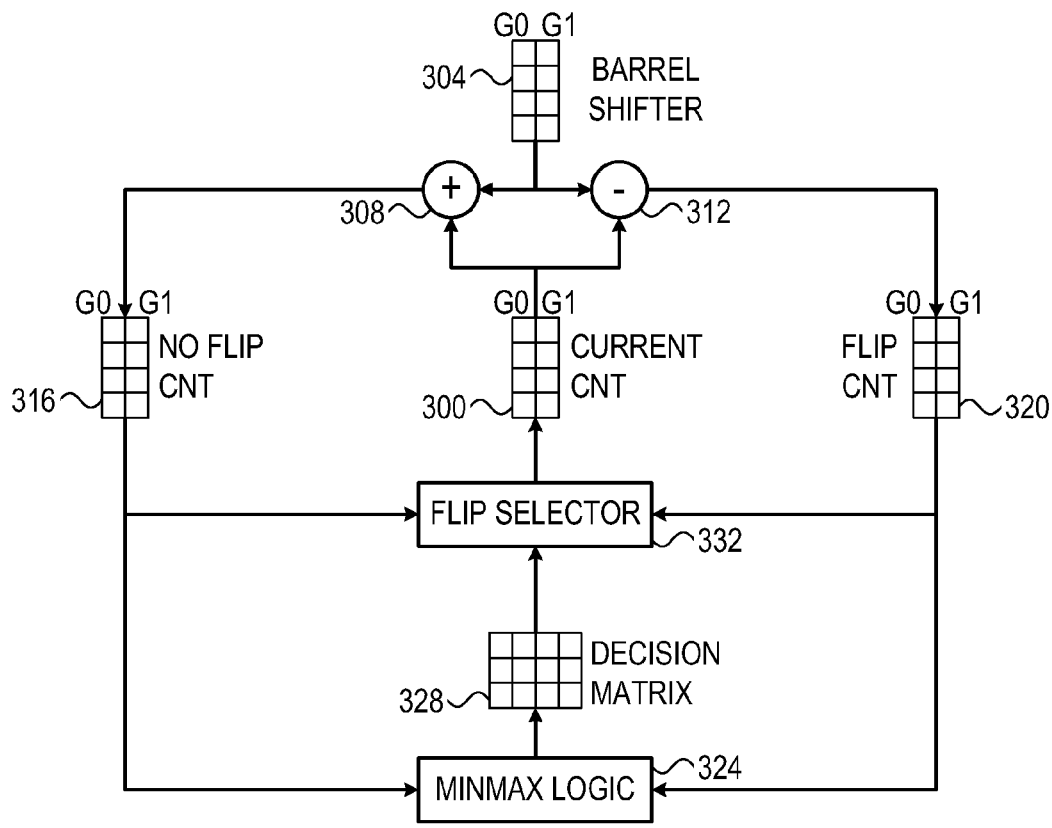
FIG. 6 is a block diagram that schematically illustrates a scheme for approximate balancing, in accordance with an embodiment of the present invention.

FIG. 6 is a block diagram that schematically illustrates a scheme for approximate balancing, in accordance with an embodiment of the present invention. The present method can be used for example at step 104 in the method of FIG. 4 above, to approximately balance the common section.

The common section is segmented into multiple subsections (or chunks), wherein LSB page or MSB page bits in a subsection may only be flipped as a unit. In an example embodiment the common section is segmented into N=64 subsections, however any other suitable segmentation may be used.

The memory controller first approximately balances the LSB page. Since bits are flipped in units of subsections, an optimal solution would search among all the possible combinations of flipping subsections to find the flipping combination that minimizes the overall ones-excess. Such a solution is however non feasible since for N subsection there are $2^N$ possible flipping combinations.

The method of FIG. 6 describes a suboptimal but implementation-friendly greedy approach. The underlying principle is to perform a sequential cyclic scan over the subsections and at each step check whether the cumulative ones-excess is increased or decreased by flipping all the bits of the next subsection. The method enforces an additional constraint, i.e., the decision whether to flip or not to flip a subsection is final, and does not change as the process continues to subsequent subsections. Thus, starting with the first subsection, each of the N−1 subsequent subsections may be flipped or left as is. The set of binary flipping decisions is also referred to as a flipping sequence and it has a length of N−1. Alternatively, it is possible to start with the second or any other subsection and still derive a respective cyclic flipping sequence that wraps over to the first subsection after deciding for the last subsection.

The method that is described below, searches among N alternative flipping sequences in parallel, wherein each alternative flipping sequence starts with one of the N subsections.

The method of FIG. 6 is described for a MSB page. Variant methods for a LSB page and for higher bit significant pages are described further below.

For each subsection, the cells are partitioned into two groups. A group denoted G0 that comprises cells in RANGE01, and a group denoted G1 that comprises cells in RANGE23. Assume the difference between the number of one-bits and zero-bits (i.e., the ones-excess value) in G0 and G1 is denoted E0 and E1 respectively. As described below, the method minimizes the maximal ones-excess between G0 and G1, i.e., between E0 and E1.

The method of FIG. 6 comprises three steps: 1) an initialization step, 2) a loop step that runs N−1 times, and 3) a termination step. The three steps are detailed below.

Initialization Step:

The method begins with memory controller 24 calculating the ones-excess value per each subsection and group, and stores the 2N results in respective cells of current counter 300. Thus, the current counter 300 initially holds N ones-excess values for G0 and N ones-excess values for G1. In FIG. 6, N=4. The sum of values per group represents the overall ones-excess for that group. The controller cell-wise copies the contents of current counter 300 to barrel shifter 304.

By flipping one or more subsections it may be possible to reduce the overall ones-excess value. Note however, that flipping a subsection may reduce the ones-excess in one group and simultaneously increase the ones excess in the other group. For example, assume that the current partial cumulative ones-excess for G0 and G1 is 3 and −3 respectively. If the ones-excess in the next subsection is 1 in both groups, then by flipping, the ones-excess in G0 improves to 2 but in G1 the ones-excess degrades to −4.

Loop Step:

The loop step is described for the $i^{th}$ step wherein $1 \leq i \leq N-1$. The memory controller first performs one cyclic shift downwards in barrel shifter 304. The memory controller then uses an addition unit 308 to calculate the sum of the barrel shifter and the current counter and stores the result in a no-flip counter 316. Similarly, the memory controller uses a subtraction unit 312 to subtract the content of the barrel shifter from the current counter and store the results in a flip counter 320. The flip/no-flip counter holds values that represent potential cumulative ones-excess values up to the $i^{th}$ step (inclusive) due to flip/no-flip decisions.

For each of the flip and no-flip counters, the memory controller selects (per row n, $1 \leq n \leq N$) the value in G0 or in G1 as follows: Let FlipG0(n) and FlipG1(n) denote the respective values in the $n^{th}$ row of flip counter 320, and let NoflipG0(n), NoflipG1(n) denote the respective values in the $n^{th}$ row of no-flip counter 316. A minmax logic 324 analyzes the content in the flip and no-flip counters to derive flipping decisions.

For flip counter 320, the minmax logic selects for each row n, a maximal flip counter denoted FLIP(n), wherein FLIP(n) =max{FlipG0(n), FlipG1(n)}. Similarly for no-flip counter 316, the minmax logic selects for each row n, a maximal no-flip counter denoted NOFLIP(n) according to the rule NOFLIP(n)=max{NoflipG0(n), NoflipG1(n)}. The minmax logic next calculates N binary flipping decision values based on the minimal value between FLIP(n) and NOFLIP(n). The memory controller stores the N decision values in the $i^{th}$ row of a decision matrix 328, wherein i=1, ... , N−1 denotes the step number. The decision matrix thus comprises N−1 rows, each storing N binary decision values. In FIG. 6, the dimension of the decision matrix is 3×4.

Flip selector 332 is configured to copy rows either from flip counter 320 or from no-flip counter 316 into current counter 300 according to the last decision values stored in decision matrix 328. For example, if in the $i^{th}$ loop iteration, the $n^{th}$ decision in the $i^{th}$ row of the matrix is to flip/no-flip, then the G0 and G1 values stored in the $n^{th}$ row of the flip/no-flip counter are copied by the flip selector to the $n^{th}$ row of the current counter.

The memory controller then loops back to the beginning of the loop step to perform the $(i+1)^{th}$ step. Alternatively, the memory controller proceeds to the termination step if i=N−1.

Termination step: the termination step is performed after the memory controller iterates the loop step N−1 times, and the decisions matrix is filled. The memory controller analyzes current counter 300 using minmax logic 324 to select a row (indexed by p) resulting with the minimal result. The memory controller then uses the index p to select from decision matrix 328 the $p^{th}$ column and respective flipping sequence that results in the minimal cumulative ones-excess. Since the column comprises N−1 decisions, and since the first chunk in each sequence is never flipped, the memory controller appends a no-flip decision ('0') at the beginning of the flipping sequence. Note that if p denotes the index to the selected column, the memory controller performs a p-step upwards cyclic shift to that column to derive the respective flipping sequence.

The method of FIG. 6 uses minmax logic as described above, however, any other suitable logic configurations may be used. For example, in the loop step where calculating FLIP(n)=max{FlipG0(n),FlipG1(n)} (or similarly in calculating NOFLIP(n)), the max(•) operator may be replaced with a mean(•), a median(•) or any other suitable operator.

The method of FIG. 6 can be modified to a variant method for processing a LSB page. For a LSB page, cells are not segmented into G0 and G1 groups. Therefore each of the counters in FIG. 6 comprises a column of N values. Additionally, flipping decisions are based only on the minimal between the flip/no-flip counters.

The method of FIG. 6 may be readily extended to more than 2 bits/cell. For example, for a 3 bits/cell device, for processing the USB page, each subsection of the common section is divided into four groups G0-G3 based on the possible lower bits combinations {00, 01, 10, 11}. Accordingly, the current, flip and no-flip counters comprise four columns of N values and the max(•) operator selects one out of four groups.

In the method of FIG. 6, chunks of bits rather than individual bits are flipped. The flipping information can therefore comprise the locations or indices of the flipped chunks. As an example, for N=64 chunks, a 64 bit word can identify flipped chunks using a single bit per chunk.

Efficient Bit Flipping

In some of the methods described above, sequence balancing is carried out by flipping the first i bits. In principle it is possible to sequentially flip single bits until the sequence is balanced. This approach, however, consumes significant number of CPU cycles. An efficient method for bit flipping is described herein. The method is mainly based on two principles: 1) segmenting the bit sequence into smaller chunks and 2) parallel calculation of flipping up to multiple indices within a chunk.

Assume a sequence X comprising N bits, whose ones-excess value is given by $D_0(X)$. Further assume that X is segmented into chunks of nb bits. In an example embodiment, nb may be configured to 8, 16 or 32 bits. Alternatively, however, any other suitable chunk size may be used. Let $X_k$ denote the $k^{th}$ chunk (k=0, ... , N/nb−1), and let $D_0(X_k)$ denote the ones-excess of that chunk. $D_0(X_k)$ may be positive, negative or zero. Moreover, $D_0(X)$ equals the sum of $D_0(X_k)$ of all the chunks. Note that flipping an entire chunk can change the total ones-excess by no more than |nb|. To balance X, typically some of the first chunks are fully flipped, and a number of bits, lower than the chunk size are additionally flipped.

The method begins with the memory controller calculating a chunk index k0 given by k0=floor(|$D_0(X)$|/nb|). The memory controller flips all the bits of the first k0 chunks, as the flipping index for balancing X must be in a chunk indexed by k0+1 or above. For example, if $D_0(X)$=23 and nb=8 bits/chunk, the first two chunks are flipped and the method should search the balancing flipping index in the third chunk or above. The ones-excess after flipping the first k0 chunks is denoted D0, wherein D0 is given by D0=$D_{(k0 \cdot nb)}(X)$.

The method then sequentially processes chunks starting with the chunk indexed by k=k0+1. When processing the $k^{th}$ chunk, the memory controller calculates in parallel nb ones-excess values denoted $D_j(X_k)$ wherein j=1 ... nb. The parallel calculation essentially speeds up the method by a factor of nb relative to bit by bit flipping.

If the memory controller can find an index j within the currently processed chunk so that D0+$D_j(X_k)$=0 then the memory controller flips the first j bits of the current chunk to balance the sequence X. Otherwise, the memory controller flips the entire chunk and proceeds to process the next chunk.

In alternative embodiments, the described method can be readily extended to create a desired imbalance E>0, wherein |$D_0(X)$|≥E. In this case, the calculation for k0 above is replaced by K0=floor([|$D_0(X)$|−E]/nb). Additionally, the condition D0+$D_j(X_k)$=0 is replaced by a relaxed condition given by |D0+$D_j(X_k)$|=E or |D0+$D_j(X_k)$|≤E.

The methods described above are exemplary methods, and other methods can be used in alternative embodiments. For example, the memory controller may use flipping patterns other than sequential bits flipping. For example, the memory controller may consider to flip (or not to flip) bits that are in constant distance apart, such as once every second, third or any other suitable number of bits.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:

receiving a plurality of data bits for storage in a memory, wherein the memory includes a plurality of pages, wherein each page of the plurality of pages includes a plurality of memory cells, and wherein each memory cell of the plurality of memory cells is configured to store multiple data bits;

determining a first number of bits to modify of a first subset of the plurality of data bits;

modifying the first number of bits of the first subset of the plurality of data bits to generate a first set of modified data bits;

determining a second number of bits to modify of a second subset of the plurality of data bits dependent upon values of a first portion of the first set of modified data bits and a value of at least one data bit of the second subset;

modifying the second number of bits of the second subset of the plurality of data bits to generate a second set of modified data bits;

determining a third number of bits to modify of a third subset of the plurality of data bits dependent upon values of a second portion of the first set of modified data bits and a value of at least one data bit of the third subset;

modifying the third number of bits of the third subset of the plurality of data bits to generate a third set of modified data bits; and storing the first set of modified data bits, the second set of modified data bits, and the third set of modified data bits in respective first, second, and third subsets of the plurality of memory cells included in a given page of the plurality of pages.

2. The method according to claim 1, wherein modifying the first number of bits of the first subset of the plurality of data bits comprises splitting the plurality of data bits into multiple significance bit pages, and modifying the first number of bits of a first significance bit page of the multiple significance bit pages.

3. The method according to claim 2, wherein modifying the second number of bits of the second subset of the plurality of data bits comprises modifying the second number of bits of a second significance bit page of the multiple significance bit pages.

4. The method according to claim 3, wherein modifying the third number of bits of the third subset of the plurality of data bits comprises modifying the third number of bits of a third significance bit page of the multiple significance bit pages.

5. The method according to claim 1, wherein determining the second number of bits to modify of the second subset of the plurality of data bits comprises processing the second subset of the plurality of data bits after processing the first subset, wherein a decision on a value of the first number is fixed when processing the second subset.

6. The method according to claim 1, wherein determining the first number of bits to modify of the first subset of the plurality of data bits comprises accumulating an imbalance measure over the first subset, wherein the imbalance measure corresponds to a number of data bits with a value of one minus a number of data bits with a value of zero.

7. The method according to claim 1, wherein modifying the first number of bits of the first subset of the plurality of data bits comprises flipping values of the first number of bits of the first subset, and wherein storing the first set of modified data bits comprises storing flipping information that is indicative of the first number of bits.

8. The method according to claim 7, further comprising recovering the plurality of data bits by flipping the values of the flipped bits a second time using the flipping information.

9. The method according to claim 7, wherein flipping the values of the first number of bits comprises flipping a sequential set of the first number of bits.

10. The method according to claim 7, further comprising segmenting the first subset of the plurality of data bits into a first plurality of sub-sections that are each selectively flipped as a unit, wherein flipping the bits comprises flipping a number of the first plurality of sub-sections.

11. The method according to claim 10, further comprising segmenting the second subset of the plurality of data bits into a second plurality of sub-sections that are each selectively flipped as a unit, wherein modifying the second number of bits comprises checking, in parallel, multiple bit flipping alternatives in the third subset of the plurality of data bits.

12. An apparatus, comprising:

a memory comprising a plurality of pages, wherein each page of the plurality of pages includes a plurality of memory cells, and wherein each memory cell of the plurality of memory cells is configured to store multiple data bits; and a memory controller configured to:

receive a plurality of data bits for storage in the memory;

determine a first number of bits to modify of a first subset of the plurality of data bits;

modify the first number of bits of the first subset of the plurality of data bits to generate a first set of modified data bits;

determine a second number of bits to modify of a second subset of the plurality of data bits dependent upon values of a first portion of the first set of modified data bits and a value of at least one data bit of the second subset modify the second number of bits of the second subset of the plurality of data bits to generate a second set of modified data bits;

determine a third number of bits to modify of a third subset of the plurality of data bits dependent upon values of a second portion of the first set of modified data bits and a value of at least one data bit of the third subset;

modify the third number of bits of the third subset of the plurality of data bits to generate a third set of modified data bits; and store the first set of modified data bits, the second set of modified data bits, and the third set of modified data bits in respective first, second, and third subsets of the plurality of memory cells included in a given page of the plurality of pages.

13. The apparatus according to claim 12, wherein to modify the first number of bits of the first subset, the memory controller is further configured to:

split the plurality of data bits into multiple significance bit pages, and modify the first number of bits of a first significance bit page of the multiple significance bit pages.

14. The apparatus according to claim 13, wherein to modify the second number of bits of the second subset, the memory controller is further configured to modify the second number of bits of a second significance bit page of the multiple significance bit pages.

15. The apparatus according to claim 14, wherein to modify the third number of bits of the third subset, the memory controller is further configured to modify the third number of bits of a third significance bit page of the multiple significance bit pages.

16. The apparatus according to claim 12, wherein to determine the second number of bits to modify of the second subset, the memory controller is further configured to process the second subset of the plurality of data bits after processing the first subset, wherein a decision on a value of the first number is fixed when processing the second subset.

17. The apparatus according to claim 12, wherein to modify the first number of bits of the first subset, the memory controller is further configured to flip values of the first number of bits of the first subset, and wherein to store the first set of modified data bits, the memory controller is further configured to store flipping information that is indicative of the first number of bits.

18. The apparatus according to claim 17, wherein the memory controller is further configured to flip the values of a sequential set of the first number of bits starting with a first bit of the first subset.

19. The apparatus according to claim 17, wherein the memory controller is further configured to segment the first subset of the plurality of data bits into a first plurality of sub-sections that are each selectively flipped as a unit.

20. An apparatus, comprising:
an interface for communicating with a memory, wherein the memory includes a plurality of pages, wherein each page of the plurality of pages includes a plurality of memory cells, and wherein each memory cell of the plurality of memory cells is configured to store multiple data bits; and
a processor configured to:
receive a plurality of data bits for storage in the memory;
determine a first number of bits to modify of a first subset of the plurality of data bits;
modify the first number of bits of the first subset of the plurality of data bits to generate a first set of modified data bits;
determine a second number of bits to modify of a second subset of the plurality of data bits dependent upon values of a first portion of the first set of modified data bits and a value of at least one data bit of the second subset
modify the second number of bits of the second subset of the plurality of data bits to generate a second set of modified data bits;
determine a third number of bits to modify of a third subset of the plurality of data bits dependent upon values of a second portion of the first set of modified data bits and a value of at least one data bit of the third subset;
modify the third number of bits of the third subset of the plurality of data bits to generate a third set of modified data bits; and
store the first set of modified data bits, the second set of modified data bits, and the third set of modified data bits in respective first, second, and third subsets of the plurality of memory cells included in a given page of the plurality of pages,
wherein each of the first set of modified data bits is programmed to one of a first pair of voltage thresholds, each of the second set of modified data bits is programmed to one of a second pair of voltage thresholds, different from the first pair and each of the third set of modified data bits is programmed to one of a third pair of voltage thresholds, different from the first pair and the second pair.

* * * * *